United States Patent
Ko

(10) Patent No.: US 9,405,313 B2
(45) Date of Patent: Aug. 2, 2016

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Bok Rim Ko, Seoul (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 316 days.

(21) Appl. No.: 14/283,407

(22) Filed: May 21, 2014

(65) Prior Publication Data
US 2015/0198968 A1    Jul. 16, 2015

(30) Foreign Application Priority Data
Jan. 13, 2014 (KR) .................. 10-2014-0003811

(51) Int. Cl.
*G06F 1/08* (2006.01)
(52) U.S. Cl.
CPC ........................................ *G06F 1/08* (2013.01)
(58) Field of Classification Search
CPC ........................................................ G06F 1/08
See application file for complete search history.

(56) References Cited

U.S. PATENT DOCUMENTS

| 7,043,652 | B2 | 5/2006 | Matsui |
| 2004/0097093 | A1* | 5/2004 | Fukuyama ............. G11C 29/30 438/735 |
| 2007/0076516 | A1* | 4/2007 | Fujisawa ............. G11C 7/1045 365/233.11 |

FOREIGN PATENT DOCUMENTS

KR    1020120063137 A    6/2012

* cited by examiner

*Primary Examiner* — Eric Oberly
(74) *Attorney, Agent, or Firm* — William Park & Associates Ltd.

(57) ABSTRACT

The semiconductor device includes a command generator, an information signal storage unit, a termination signal generator and a code generator. The command generator generates a mode register write command signal, a start command signal and a termination command signal from external command signals. The information signal storage unit extracts information signals from the external command signals to store the information signals and output the information signals. The termination signal generator generates a termination signal in response to the information signals. The code generator generates code signals to control a timing of a control signal.

20 Claims, 8 Drawing Sheets

FIG.2

| CKE | CS | CA<1> | CA<2> | CA<3> | CA<4> | CA<5> | CA<6> |
|---|---|---|---|---|---|---|---|
| 1 | 0→1 | 0 | 0 | 0 | 0 | 0 | OP<7> |
| | 1→0 | OP<1> | OP<2> | OP<3> | OP<4> | OP<5> | OP<6> |

| OP<1:7> | 1001011 | CMD_START ENABLE |
|---|---|---|
| | 1001101 | CMD_STOP ENABLE |

FIG.3

| | | |
|---|---|---|
| IS<1:M> | 000 ⋯ 00 | Command based stop |
| | 000 ⋯ 01 | Stop at 16th clock cycle |
| | 000 ⋯ 10 | Stop at 32th clock cycle |
| | ⋮ | ⋮ |
| | 111 ⋯ 11 | Stop at $(2^M-1) \times 16_{th}$ clock cycle |

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2014-0003811, filed on Jan. 13, 2014, in the Korean Intellectual Property Office, which is incorporated herein by reference in its entirety as set forth in full.

BACKGROUND

1. Technical Field

Embodiments of the present disclosure relate to semiconductor integrated circuits and, more particularly, to semiconductor devices and semiconductor systems including the same.

2. Related Art

Mobile systems such as portable computers, personal digital assistants (PDAs) and portable phones have been developed to reduce the weight thereof for portability. Batteries supplying electric power to the mobile systems may largely affect the total weight of the mobile systems. If power consumption of semiconductor devices employed in the mobile systems is lowered, the capacity of the batteries may also be reduced to thus decrease the total weight of the mobile systems. Fast mobile systems are increasingly in demand with the development of multi-functional mobile systems. Accordingly, data transmission speeds of the semiconductor devices such as mobile memory devices (also, referred to as 'mobile memory chips') may be important factors in determination of operation speeds of the high performance mobile systems.

SUMMARY

According to an embodiment, a semiconductor device includes a command generator, an information signal storage unit, a termination signal generator and a code generator. The command generator is suitable for generating a mode register write command signal, a start command signal and a termination command signal from external command signals in response to an external control signal. The information signal storage unit is suitable for extracting information signals from the external command signals in response to the mode register write command signal to store the information signals and output the information signals. The termination signal generator is suitable for generating a termination signal in response to the information signals. The code generator is suitable for generating code signals to control a timing of a control signal in response to the start command signal, the termination command signal and the termination signal.

According to an embodiment, a semiconductor system includes a controller and a semiconductor device. The controller is suitable for generating an external control signal and external command signals and receiving code signals to control timing of a control signal. The semiconductor device is suitable for generating a start command signal, a termination command signal and information signals from the external command signals in response to the external control signal, generating a termination signal in response to the information signals, and generating the code signals in response to the start command signal, the termination command signal and the termination signal.

In an embodiment, a semiconductor system includes a controller configured to generate a command/address signals, a clock enable signal, and a chip selection signal. The semiconductor system also includes a semiconductor device configured to receive the command/address signals, the clock enable signal, and the chip selection signal and generate a mode register write command, a start command signal, a termination command signal, a termination signal and code signals.

BRIEF DESCRIPTION OF THE DRAWINGS

FIG. 2 is a table illustrating an operation of a command generator included in the semiconductor system of FIG. 1;

FIG. 3 is a table illustrating information signals outputted from an information signal storage unit included in the semiconductor system of FIG. 1;

DETAILED DESCRIPTION

Various embodiments of the inventive concept will be described hereinafter with reference to the accompanying figures. However, the embodiments described are for illustrative purposes only and not intended to limit the scope of the inventive concept. Semiconductor devices have been designed to simultaneously receive command signals and address signals through a plurality of pins. In such a case, the signals inputted through the plurality of pins include all information on the command signals and the address signals. In addition, a command decoder and an address decoder decode the singles inputted through the plurality of pins to extract the command signals and the address signals. In the case of synchronous semiconductor devices, the command signals and the address signals are inputted in synchronization with a clock signal. Double data rate (DDR) semiconductor devices receive the command signals and the address signals in synchronization with a rising edge and a falling edge of the clock signal. In addition, single data rate (SDR) semiconductor devices receive the command signals and the address signals in synchronization with a rising edge of the clock signal. The invention may comprise various embodiments directed to semiconductor devices and semiconductor systems including the same.

Figure 1:
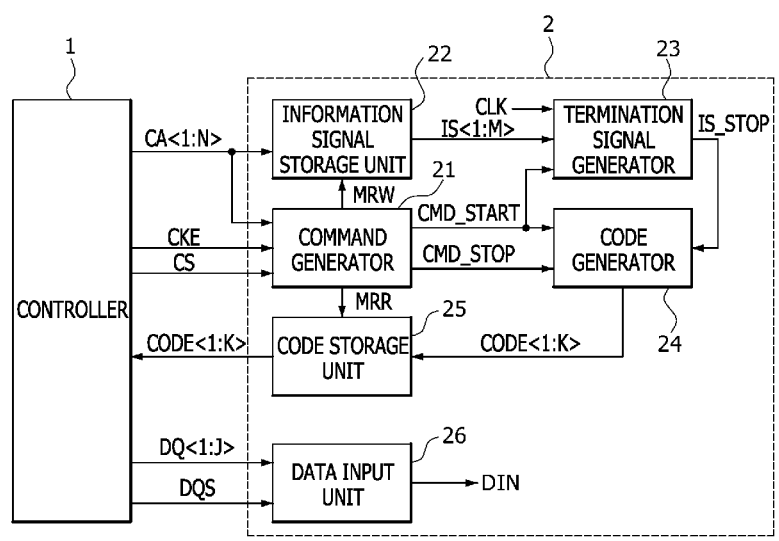
FIG. 1 is a block diagram illustrating a semiconductor system according to an embodiment of the inventive concept.

Referring to FIG. 1, a semiconductor system may include a controller 1 and a semiconductor device 2. Further, the semiconductor device 2 may include a command generator 21, an information signal storage unit 22, a termination signal generator 23, a code generator 24, a code storage unit 25 and a data input unit 26.

The controller 1 may be configured to apply command/address signals CA<1:N>, a clock enable signal CKE and a chip selection signal CS to the semiconductor device 2. The clock enable signal CKE may be enabled to generate an internal clock signal. The chip selection signal CS may be an external control signal enabled to select a chip (not shown) including the semiconductor device 2. The command/address signals CA<1:N> may include external command signals and external address signals. In addition, the command/address signals CA<1:N> may be inputted to the semiconductor device 2 through the same pin (not shown). In the alternative, the semiconductor system may be designed such that the external command signals are separated from the external address signals and input pins for the external command signals are different from input pins for the external address signals. The controller 1 may be configured to receive code signals CODE<1:K> generated from the semiconductor device 2 to control a timing of a data strobe signal DQS. The controller 1 may also be configured to detect variation of process/voltage/temperature (PVT) conditions using the code signals CODE<1:K> to control the timing of the data strobe signal DQS corresponding to a control signal which is used for strobe of data DQ<1:J>. The controller 1 may be configured to apply the data DQ<1:J> and the data strobe signal DQS to the semiconductor device 2. The variation of the PVT conditions may mean that at least one of a process, a voltage and a temperature in the semiconductor device 2 varies accordingly.

The command generator 21 may be configured to receive the command/address signals CA<1:N> in response to clock enable signal CKE and the chip selection signal CS to generate a mode register write command signal MRW, a start command signal CMD_START, a termination command signal CMD_STOP and a mode register read command signal MRR. One of the signals generated by the command generator 21 may be selectively enabled according to logic levels of the command/address signals CA<1:N>. Referring to FIG. 2, while the clock enable signal CKE has a logic "high(1)" level, the command generator 21 may receive set signals OP<1:7> to enable the start command signal CMD_START or the termination command signal CMD_STOP if first to fifth command/address signals CA<1:5> having a logic level combination of '00000' are inputted to the command generator 21. Moreover, the first to fifth command/address signals CA<1:5> may be inputted to the command generator 21 when the chip selection signal CS is changed from a logic "low(0)" level to a logic "high(1)" level. As a result, the start command signal CMD_START or the termination command signal CMD_STOP may be enabled. More specifically, the command generator 21 may be configured to receive the set signal OP<7> as a sixth command/address signal CA<6> when the chip selection signal CS is changed from a logic "low(0)" level to a logic "high(1)" level. In addition, the command generator 21 may be configured to receive the set signals OP<1:6> as the first to sixth command/address signals CA<1:6> when the chip selection signal CS is changed from a logic "high(1)" level to a logic "low(0)" level. The command generator 21 may be configured to generate the start command signal CMD_START enabled if the set signals OP<1:7> have a logic level combination of '1001011.' In addition, the command generator 21 may generate the termination command signal CMD_STOP enabled if the set signals OP<1:7> have a logic level combination of '1001101.' Logic level combinations of the command/address signals CA<1:N> to enable the mode register write command signal MRW, the start command signal CMD_START, the termination command signal CMD_STOP and the mode register read command signal MRR may be set to be different according to various embodiments.

The information signal storage unit 22 may be configured to extract information signals IS<1:M> from the command/address signals CA<1:N> to store the information signals IS<1:M> and output the information signals IS<1:M> while the mode register write command signal MRW is enabled. A design scheme to transmit the command/address signals CA<1:N> including the information signals IS<1:M> may be set to be different according to various embodiments. The information signals IS<1:M> may include information on when a termination signal IS_STOP is enabled. For example, referring to FIG. 3, the termination signal IS_STOP may maintain a disabled state if the information signals IS<1:M> have a logic level combination of '000 . . . 00.' In addition, if the information signals IS<1:M> have a logic level combination of '000 . . . 01,' the termination signal IS_STOP may be enabled when sixteen cycles of a clock signal CLK elapse after the start command signal CMD_START is enabled. Further, if the information signals IS<1:M> have a logic level combination of '000 . . . 10,' the termination signal IS_STOP may be enabled when thirty two cycles of the clock signal CLK elapse after the start command signal CMD_START is enabled. Moreover, if the information signals IS<1:M> have a logic level combination of '111 . . . 11,' the termination signal IS_STOP may be enabled when (2M−1)×16 cycles of the clock signal CLK elapse after the start command signal CMD_START is enabled. Logic level combinations of the information signals IS<1:M> to control points of time that termination signal IS_STOP is enabled may also be set to be different according to various embodiments.

The termination signal generator 23 may be configured to generate the termination signal IS_STOP whose enablement moment is controlled according to the information signals IS<1:M>. The termination signal IS_STOP may be enabled when a predetermined time (i.e., expressed by a multiple of the cycle of the clock signal CLK) set by the information signals IS<1:M> elapses after the start command signal CMD_START is inputted to the termination signal generator 23. The termination signal generator 23 may be configured to generate the termination signal IS_STOP whose enablement moment and disabled state are controlled according to logic levels of the information signals IS<1:M>.

The code generator 24 may be configured to generate the code signals CODE<1:K> counted in response to the start command signal CMD_START, the termination command signal CMD_STOP and the termination signal IS_STOP. The code generator 24 may start to count the code signals CODE<1:K> when the start command signal CMD_START is enabled and may terminate to count the code signals CODE<1:K> when the termination command signal CMD_STOP or the termination signal IS_STOP is enabled. If the PVT condition varies, a speed that the code signals CODE<1:K> are counted may vary. Further, logic levels of the code signals CODE<1:K> may be set according to the count period of the code signals CODE<1:K>.

The code storage unit 25 may be configured to store the code signals CODE<1:K> outputted from the code generator 24. The code storage unit 25 may be configured to transmit the code signals CODE<1:K> to the controller 1 if the mode register read command signal MRR is enabled. The controller 1 may be configured to detect variation of the PVT condition using the code signals CODE<1:K> to control the timing of the data strobe signal DQS that corresponds to a control signal which is used for strobe of the data DQ<1:J>.

The data input unit 26 may be configured to receive the data DQ<1:J> in response to the data strobe signal DQS whose timing is controlled by the controller 1 to generate internal data DIN. In various embodiments, the controller 1 may be configured to control the timing of the data strobe signal DQS for strobe of a plurality of data and to apply the controlled data strobe signal DQS to the semiconductor device 2.

Figure 4:
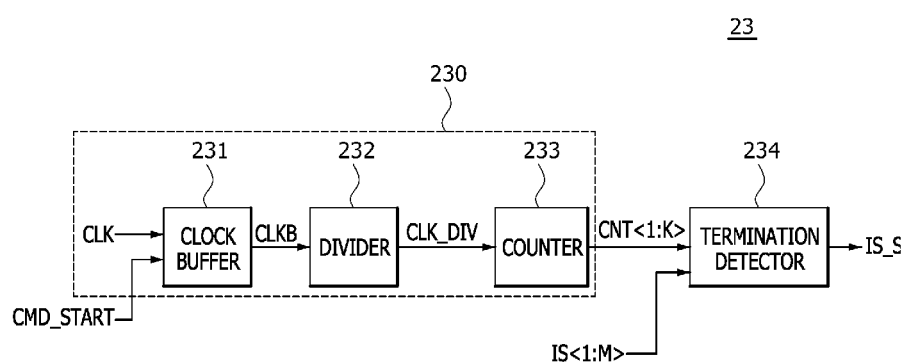
FIG. 4 is a block diagram illustrating a termination signal generator included in the semiconductor system of FIG. 1.

Referring to FIG. 4, the termination signal generator 23 may be configured to include a count signal generator 230 and a termination detector 234. The count signal generator 230 may be configured to include a clock buffer 231, a divider 232 and a counter 233. The clock buffer 231 may be configured to buffer the clock signal CLK to generate an inverse clock signal CLKB if the start command signal CMD_START is enabled. The divider 232 may be configured to divide the inverse clock signal CLKB to generate a division clock signal CLK_DIV. The counter 233 may be configured to generate count signals CNT<1:K> sequentially counted in synchronization with the division clock signal CLK_DIV. The termination detector 234 may be configured to receive the count signals CNT<1:K> and the information signals IS<1:M>. The termination detector 234 may also be configured to generate the termination signal IS_STOP if the count signals CNT<1:K> have a logic level combination corresponding to the information signals IS<1:M>. A logic level combination corresponding to the information signals IS<1:M> may be set to be different according to various embodiments.

Figure 5:
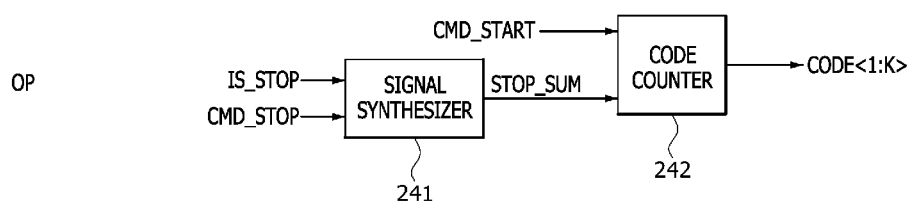
FIG. 5 is a block diagram illustrating a code generator included in the semiconductor system of FIG. 1.

Referring to FIG. 5, the code generator 24 may be configured to include a signal synthesizer 241 and a code counter 242. The signal synthesizer 241 may be configured to synthesize the termination signal IS_STOP and the termination command signal CMD_STOP to generate a synthetic termination signal STOP_SUM. The synthetic termination signal STOP_SUM may be enabled when the termination signal IS_STOP or the termination command signal CMD_STOP is enabled. The code counter 242 may be configured to start to count the code signals CODE<1:K> when the start command signal CMD_START is enabled and may terminate to count the code signals CODE<1:K> when the synthetic termination signal STOP_SUM is enabled.

An operation of the semiconductor system having the aforementioned configuration will be described with reference to FIGS. 6 and 7.

Figure 6:
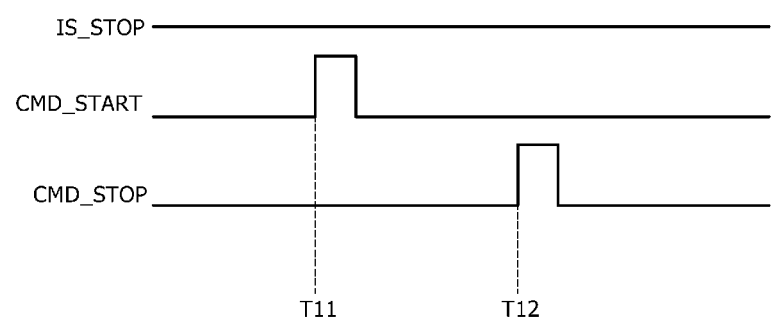
FIGS. 6 and 7 are timing diagrams illustrating an operation of the semiconductor system shown in FIG. 1.

Referring to FIG. 6, while the termination signal IS_STOP is disabled to have a logic "low" level, the code signals CODE<1:K> may be counted from a time "T11" that the start command signal CMD_START is enabled till a time "T12" that the termination command signal CMD_STOP is enabled. As illustrated in FIG. 2, the termination signal IS_STOP may be configured to maintain a disabled state if the information signals IS<1:M> have a logic level combination of '000 . . . 00.'

Figure 7:
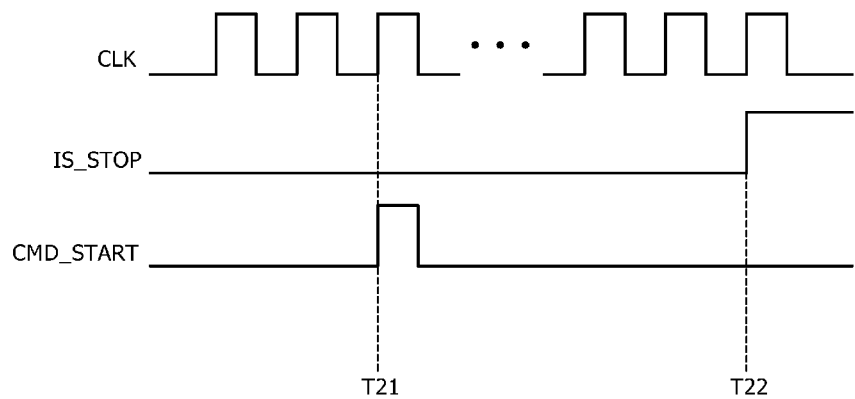

Referring to FIG. 7, if the termination signal IS_STOP is enabled to have a logic "high" level at a time "T22," the code signals CODE<1:K> may be counted from a time "T21" that the start command signal CMD_START is enabled till a time "T22" that the termination signal IS_STOP is enabled. As shown in FIG. 2, the enablement moment of the termination signal IS_STOP may be controlled according to a logic level combination of the information signals IS<1:M>.

Figure 8:
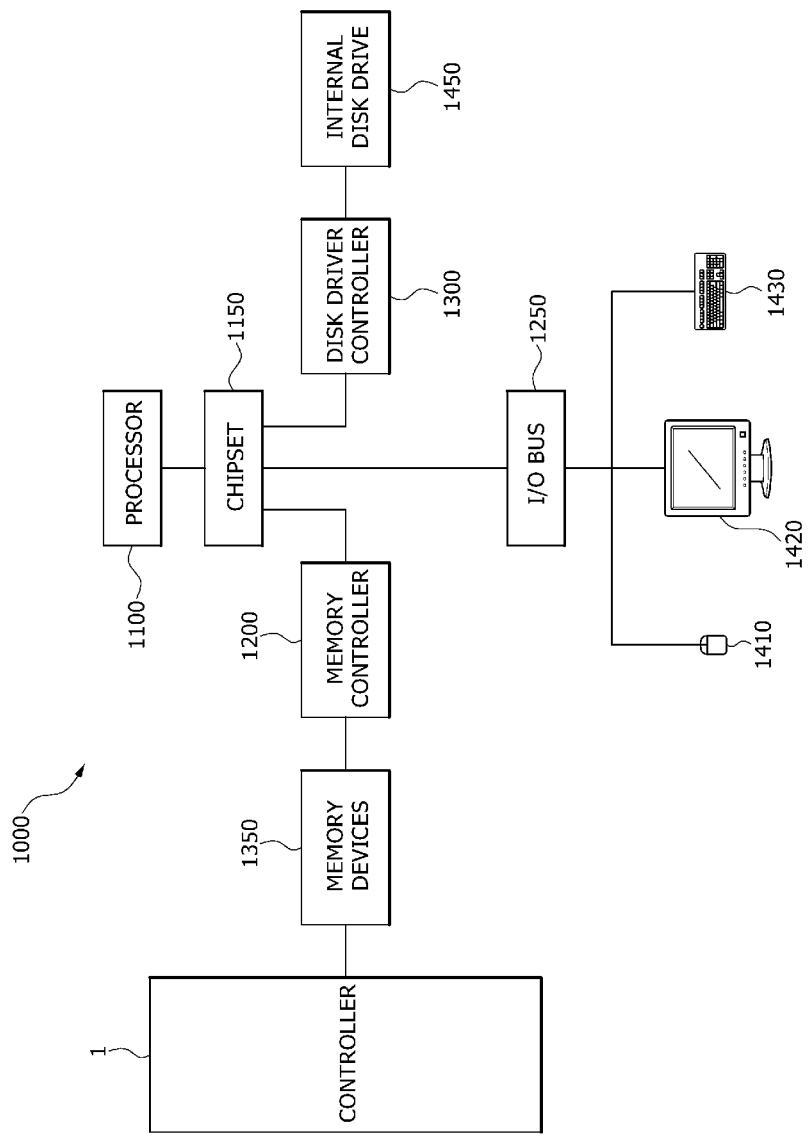
FIG. 8 illustrates a block diagram of a system employing a memory controller circuit in accordance with an embodiment of the invention.

Referring to FIG. 8, a system 1000 may include one or more processors 1100. The processor 1100 may be used individually or in combination with other processors. A chipset 1150 may be electrically coupled to the processor 1100. The chipset 1150 may be a communication pathway for signals between the processor 1100 and other components of the system 1000. Other components may include a controller 1, a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may be electrically coupled to the controller 1, and may include the semiconductor device 2 described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drive 1450 may communicate with each other or with the chipset 1150 using virtually any type of communication protocol.

As described above, the semiconductor system according to various embodiments may count the code signals CODE<1:K> during a predetermined period set by signals generated from the command/address signals CA<1:N> in response to the chip selection signal CS. A period that the code signals CODE<1:K> are counted may be set from when the start command signal CMD_START is enabled till when the termination command signal CMD_STOP is enabled. In addition, a period in which the code signals CODE<1:K> are counted may be set from when the start command signal CMD_START is enabled till when the termination signal IS_STOP is enabled. The period that the code signals CODE<1:K> are counted may be set to be constant. However, a speed that the code signals CODE<1:K> are counted may vary according to variation of the PVT condition. Therefore, a logic level combination of the code signals CODE<1:K> may vary according to the variation of the PVT condition. The controller 1 may be configured to detect the variation of the PVT condition in the semiconductor device 2 according to a logic level combination of the code signals CODE<1:K>. In addition, the controller 1 may control the timing of the data strobe signal DQS corresponding to a control signal which is used for strobe of the data DQ<1:J>.

What is claimed is:
1. A semiconductor device comprising:
a command generator suitable for generating a mode register write command signal, a start command signal and a termination command signal from external command signals in response to an external control signal;
an information signal storage unit suitable for extracting information signals from the external command signals in response to the mode register write command signal to store the information signals and output the information signals;
a termination signal generator suitable for generating a termination signal in response to the information signals; and
a code generator suitable for generating code signals to control a timing of a control signal in response to the start command signal, the termination command signal and the termination signal.
2. The semiconductor device of claim 1, wherein the external control signal is a chip selection signal to select a chip including the semiconductor device.
3. The semiconductor device of claim 1, wherein the information signals include information on a point of time that the termination signal is enabled.

4. The semiconductor device of claim 1, wherein the termination signal generator includes:
   a count signal generator suitable for generating count signals counted from a point of time that the start command signal is enabled; and
   a termination detector suitable for detecting the count signals in response to the information signals to generate the termination signal.

5. The semiconductor device of claim 4, wherein the termination detector is suitable for generating the termination signal if the count signals have a logic level combination that corresponds to the information signals.

6. The semiconductor device of claim 1, wherein the code generator includes:
   a signal synthesizer suitable for generating a synthetic termination signal in response to the termination command signal and the termination signal; and
   a code counter suitable for counting the code signals in response to the start command signal and the synthetic termination signal.

7. The semiconductor device of claim 6, wherein the synthetic termination signal is enabled when the termination command signal or the termination signal is enabled.

8. The semiconductor device of claim 7, wherein the code counter is suitable to start to count the code signals from a point of time that the start command signal is enabled and terminate to count the code signals at a point of time that the synthetic termination signal is enabled.

9. The semiconductor device of claim 1, wherein the command generator is suitable for generating a mode register read command signal from the external command signals in response to the external control signal.

10. The semiconductor device of claim 9, further comprising:
   a code storage unit suitable for storing the code signals therein and outputting the code signals in response to the mode register read command signal.

11. The semiconductor device of claim 1, wherein the control signal is a data strobe signal used for strobe of data which is inputted to the semiconductor device.

12. A semiconductor system comprising:
   a controller suitable for generating an external control signal and external command signals and receiving code signals to control a timing of a control signal; and
   a semiconductor device suitable for generating a start command signal, a termination command signal and information signals from the external command signals in response to the external control signal, generating a termination signal in response to the information signals, and generating the code signals in response to the start command signal, the termination command signal and the termination signal.

13. The semiconductor system of claim 12, wherein the control signal is a data strobe signal used for strobe of data inputted to the semiconductor device.

14. The semiconductor system of claim 12, wherein the semiconductor device is suitable for generating a mode register read command signal from the external command signals in response to the external control signal and transmitting the code signals to the controller in response to the mode register read command signal.

15. The semiconductor system of claim 12, wherein the information signals include information on a point of time that the termination signal is enabled.

16. The semiconductor system of claim 12, wherein the semiconductor device includes:
   a command generator suitable for generating a mode register write command signal, the start command signal and the termination command signal from the external command signals in response to the external control signal;
   an information signal storage unit suitable for extracting the information signals from the external command signals in response to the mode register write command signal to store the information signals and output the information signals;
   a termination signal generator suitable for generating the termination signal in response to the information signals; and
   a code generator suitable for generating the code signals in response to the start command signal, the termination command signal and the termination signal.

17. The semiconductor system of claim 16, wherein the termination signal generator includes:
   a count signal generator suitable for generating count signals counted from a point of time when the start command signal is enabled; and
   a termination detector suitable for detecting the count signals in response to the information signals to generate the termination signal.

18. The semiconductor system of claim 17, wherein the termination detector is suitable for generating the termination signal when the count signals have a logic level combination corresponding to the information signals.

19. The semiconductor system of claim 16, wherein the code generator includes:
   a signal synthesizer suitable for generating a synthetic termination signal in response to the termination command signal and the termination signal; and
   a code counter suitable for counting the code signals in response to the start command signal and the synthetic termination signal.

20. The semiconductor system of claim 19, wherein the code counter is suitable for starting to count the code signals when the start command signal is enabled and terminating to count the code signals when the synthetic termination signal is enabled.

* * * * *